(12) United States Patent
Jeong

(10) Patent No.: US 9,837,150 B2
(45) Date of Patent: Dec. 5, 2017

(54) NONVOLATILE MEMORY DEVICES HAVING VARIABLE RESISTIVE LOAD PORTION

(71) Applicant: SK hynix Inc., Gyeonggi-do (KR)

(72) Inventor: Hoe Sam Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/233,733

(22) Filed: Aug. 10, 2016

(65) Prior Publication Data

US 2017/0243640 A1    Aug. 24, 2017

(30) Foreign Application Priority Data

Feb. 19, 2016  (KR) .................. 10-2016-0019826

(51) Int. Cl.
  *G11C 11/00*  (2006.01)
  *G11C 13/00*  (2006.01)

(52) U.S. Cl.
  CPC ........ *G11C 13/004* (2013.01); *G11C 13/0038* (2013.01); *G11C 2213/77* (2013.01); *G11C 2213/79* (2013.01)

(58) Field of Classification Search
  CPC .............. G11C 13/004; G11C 2213/79; G11C 13/0038; G11C 11/1673; G11C 2213/77; G11C 13/0004

USPC ................................ 365/148, 189.09, 189.11
See application file for complete search history.

(56) References Cited

U.S. PATENT DOCUMENTS

| | | | | |
|---|---|---|---|---|
| 5,519,652 A * | 5/1996 | Kumakura | ............. | G11C 16/26 365/185.12 |
| 7,180,793 B2 * | 2/2007 | Matsuzaki | ............. | G11C 7/065 257/E27.081 |
| 8,339,860 B2 * | 12/2012 | Maruyama | ............. | G11C 16/06 365/185.2 |

FOREIGN PATENT DOCUMENTS

KR    1020120063394    6/2012

* cited by examiner

*Primary Examiner* — David Lam
(74) *Attorney, Agent, or Firm* — IP & T Group LLP

(57) ABSTRACT

A nonvolatile memory device includes a nonvolatile memory cell and a variable resistive load portion. The variable resistive load portion is coupled between a bit line of the nonvolatile memory cell and a supply voltage line. The variable resistive load portion is suitable for changing a resistance value between the bit line and the supply voltage line according to a level of a supply voltage applied to the supply voltage line.

21 Claims, 13 Drawing Sheets

NONVOLATILE MEMORY DEVICES HAVING VARIABLE RESISTIVE LOAD PORTION

CROSS-REFERENCE TO RELATED APPLICATIONS

The present application claims priority under 35 U.S.C §119(a) to Korean Patent Application No. 10-2016-0019826, filed on Feb. 19, 2016, which is herein incorporated by references in its entirety.

BACKGROUND

1. Technical Field

Various embodiments of the present disclosure relate to nonvolatile memory devices and, more particularly, to nonvolatile memory devices having a wide operation range.

2. Related Art

Semiconductor memory devices are typically categorized as random access memory (RAM) devices or read only memory (ROM) devices according to data volatility thereof. The RAM devices lose their stored data when their power supplies are interrupted. In contrast, the ROM devices retain their stored data when their power supplies are interrupted. The ROM devices may also be classified as programmable ROM (PROM) devices or mask ROM devices according to data input methods, that is, data program methods. The PROM devices may be fabricated and sold out without program and may be directly programmed by customers (i.e., users) after fabrication thereof. The mask ROM devices may be programmed during fabrication thereof using implantation masks manufactured based on data requested by users. The PROM devices may include one-time PROM (OTPROM) devices, erasable PROM (EPROM) devices and electrically erasable PROM (EEPROM) devices. Once the OTPROM devices are programmed, the programmed data of the OTPROM devices cannot be changed.

N-channel transistors or P-channel transistors may be used as cell transistors of the nonvolatile memory devices, for example, the OTPROM devices. If P-channel transistors are used as the cell transistors of the nonvolatile memory devices, the P-channel cell transistors may have a turn-off state as an initial state thereof and may have a turn-on state as a programmed state thereof. A read operation of the P-channel cell transistors may be performed by sensing a voltage level of a bit line connected to a P-channel cell transistor selected from the P-channel cell transistors. In such a case, the voltage level of the bit line may be determined by a resistance ratio of a resistance of a load resistor coupled between a supply voltage line and the bit line and an equivalent resistance of the selected P-channel cell transistor. As electronic systems become scaled down, various supply voltage levels have been required to operate the nonvolatile memory devices employed in the electronic systems. In such a case, a read operation of a nonvolatile memory device employing P-channel transistors as the cell transistors may become unstable thus limiting an operation range of the nonvolatile memory device.

SUMMARY

Various embodiments are directed to a nonvolatile memory device having a wide operation range.

According to an embodiment, a nonvolatile memory device includes a nonvolatile memory cell and a variable resistive load portion. The variable resistive load portion is coupled between a bit line of the nonvolatile memory cell and a supply voltage line. The variable resistive load portion is suitable for changing a resistance value between the bit line and the supply voltage line according to a level of a supply voltage applied to the supply voltage line.

BRIEF DESCRIPTION OF THE DRAWINGS

Various embodiments of the present invention will become more apparent in view of the attached drawings and accompanying detailed description, in which.

DETAILED DESCRIPTION OF THE EMBODIMENTS

Figure 1:
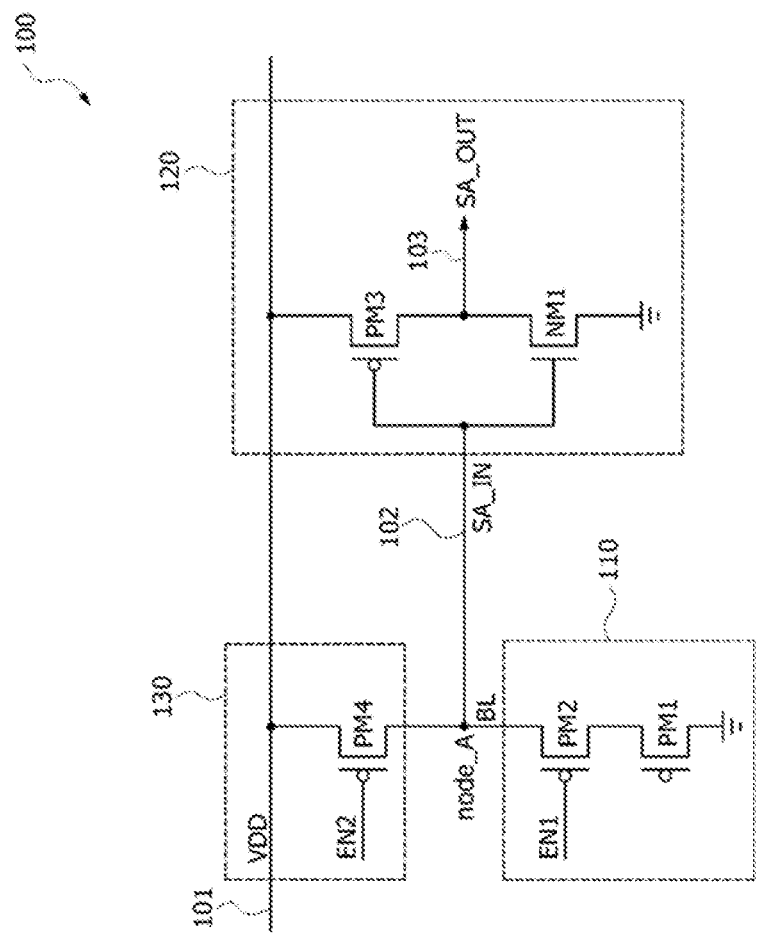
FIG. 1 is a circuit diagram illustrating a conventional nonvolatile memory device.

Example embodiments will be described in more detail with reference to the accompanying drawings. The present disclosure, however, may be embodied in various different forms, and should not be construed as being limited to the illustrated embodiments herein. Rather, these embodiments are provided as examples so that this disclosure will be thorough and complete, and will fully convey the various aspects and features of the present invention to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

In addition, when an element is referred to as being located "on", "over", "above", "under" or "beneath" another element, it is intended to mean relative position relationship and may not indicate that the element directly contacts the other element. At least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected to", or "coupled to" another element, it may be directly on, connected to, or coupled to the other element, or one or more intervening elements may be present.

In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements.

As used herein, the term "and/or" includes any and all combinations of one or more of the associated listed items.

In the following description, numerous specific details are set forth for providing a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 is a circuit diagram illustrating a conventional nonvolatile memory device 100.

Referring to FIG. 1, the nonvolatile memory device 100 may be configured to include a nonvolatile memory cell 110, a sensing circuit 120 and a resistive load portion 130. The nonvolatile memory cell 110 may be configured to include a first P-channel transistor PM1 acting as a cell transistor and a second P-channel transistor PM2 acting as a selection transistor. A gate of the first P-channel transistor PM1 may correspond to a floating gate, and a drain of the first P-channel transistor PM1 may be coupled to a ground terminal. A source of the first P-channel transistor PM1 may be coupled to a drain of the second P-channel transistor PM2. A first enablement signal EN1 acting as a selection signal may be applied to a gate of the second P-channel transistor PM2. A source of the second P-channel transistor PM2 may be coupled to a first node node_A through a bit line BL.

The sensing circuit 120 may be realized using a complementary metal-oxide-semiconductor (CMOS) inverter comprised of a first N-channel transistor NM1 and a third P-channel transistor PM3. A gate of the first N-channel transistor NM1 and a gate of the third P-channel transistor PM3 may be coupled to the first node node_A through a sensing input line 102 that transmits a sensing input signal SA_IN. A source of the first N-channel transistor NM1 may be coupled to the ground terminal. A drain of the first N-channel transistor NM1 may be coupled to a drain of the third P-channel transistor PM3. A source of the third P-channel transistor PM3 may be coupled to a supply voltage line 101 to which a supply voltage VDD is applied. The drains of the first N-channel transistor NM1 and the third P-channel transistor PM3 may be coupled to a sensing output line 103 through which a sensing output signal SA_OUT is outputted.

The resistive load portion 130 may include a resistive load coupled between the supply voltage line 101 and the first node node_A. In an embodiment, the resistive load may be realized using a fourth P-channel transistor PM4. A second enablement signal EN2 may be applied to a gate of the fourth P-channel transistor PM4. A source and a drain of the fourth P-channel transistor PM4 may be coupled to the supply voltage line 101 and the first node node_A, respectively. If the fourth P-channel transistor PM4 is turned on, the fourth P-channel transistor PM4 may act as a resistive element coupled between the supply voltage line 101 and the first node node_A.

The first P-channel transistor PM1 acting as a cell transistor may have an off-state as an initial state before program thereof and may have an on-state as a programmed state after program thereof. The state of the first P-channel transistor PM1 may be read by turning on the second and fourth P-channel transistors PM2 and PM4. In such a case, a voltage of the first node node_A may correspond to the sensing input signal SA_IN, and the sensing input signal SA_IN may be inputted to the sensing circuit 120. If the first P-channel transistor PM1 has an initial off-state, the first node A may have a voltage which is substantially equal to the supply voltage VDD because an equivalent resistance of the first P-channel transistor PM1 is much higher than an equivalent resistance of the fourth P-channel transistor PM4. If the supply voltage VDD is inputted to the sensing circuit 120, the third P-channel transistor PM3 may be turned off while the first N-channel transistor NM1 is turned on. Thus, a ground voltage may be outputted as the sensing output signal SA_OUT. If the first P-channel transistor PM1 has a programmed state, i.e., an on-state while the second and fourth P-channel transistors PM2 and PM4 may be turned on to read out the state of the first P-channel transistor PM1, the first node A may have a voltage which is substantially equal to the ground voltage because an equivalent resistance of the first P-channel transistor PM1 is lower than an equivalent resistance of the fourth P-channel transistor PM4. If the ground voltage is inputted to the sensing circuit 120, the third P-channel transistor PM3 may be turned on while the first N-channel transistor NM1 is turned off. Thus, the supply voltage VDD may be outputted as the sensing output signal SA_OUT. Accordingly, the state of the first P-channel transistor PM1 may be discriminated by a voltage level of the sensing output signal SA_OUT outputted from the sensing circuit 120.

Figure 2:
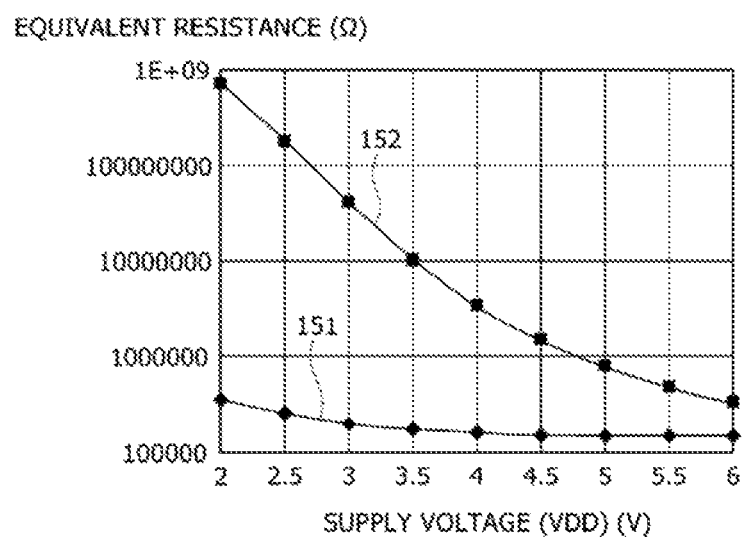
FIG. 2 is a graph illustrating equivalent resistance values of a cell transistor and a resistive portion of the nonvolatile memory device shown in FIG. 1 as a function of a supply voltage during a read operation in an initial state of the cell transistor.

FIG. 2 is a graph illustrating equivalent resistance values of the cell transistor (i.e., the first P-channel transistor PM1) and the resistive load portion (i.e., the fourth P-channel transistor PM4) of the nonvolatile memory device 100 shown in FIG. 1 as a function of the supply voltage VDD during a read operation during an initial state of the cell transistor. In FIG. 2, data plotted by a reference numeral "151" correspond to first equivalent resistance values of the resistive load portion 130, and data plotted by a reference numeral "152" correspond to second equivalent resistance values of the first P-channel transistor PM1 when the cell transistor has an initial state. Referring to FIG. 2, the first equivalent resistance values of the resistive load portion 130 may change only a little as a function of the supply voltage VDD. More precisely when the supply voltage VDD varies from about 2 to about 6 volts, the first equivalent resistance values of the resistive load portion 130 change a little in the range of about 2 to about 3.5 volts and remain practically unchanged in the range of about 3.5 to about 6 volts. In contrast, the second equivalent resistance values of the first P-channel transistor PM1 are reduced very rapidly as the supply voltage VDD increases from a range of about 2 to about 6 volts. Hence, as shown in FIG. 2, when the supply voltage VDD is lowered, a difference between the first equivalent resistance 151 of the resistive load portion 130 1 and the second equivalence resistance 152 of the first P-channel transistor PM1 is increased. On the contrary, when the supply voltage VDD is increased, a difference between the first equivalent resistance 151 of the resistive load portion 130 1 and the second equivalence resistance 152 of the first P-channel transistor PM1 is reduced.

As described with reference to FIG. 1, in the event that a ratio of the second equivalent resistance value of the first P-channel transistor PM1 (i.e., a cell transistor) having an initial state (i.e., an off-state) to the first equivalent resistance value of the fourth P-channel transistor PM4 (i.e., a resistive load portion) increases during a read operation, a voltage of the first node node_A may have a value that is close to the supply voltage VDD. However, if the supply voltage VDD increases, a ratio of the second equivalent resistance value of the first P-channel transistor PM1 having an initial state (i.e., an off-state) to the first equivalent resistance value of the fourth P-channel transistor PM4 may be reduced to cause an erroneous read operation because a voltage of the first node node_A is not sufficiently pulled up to the supply voltage VDD. As a result, if the supply voltage VDD increases, a read margin of the first P-channel transistor PM1 (acting as the cell transistor) may be reduced.

Figure 3:
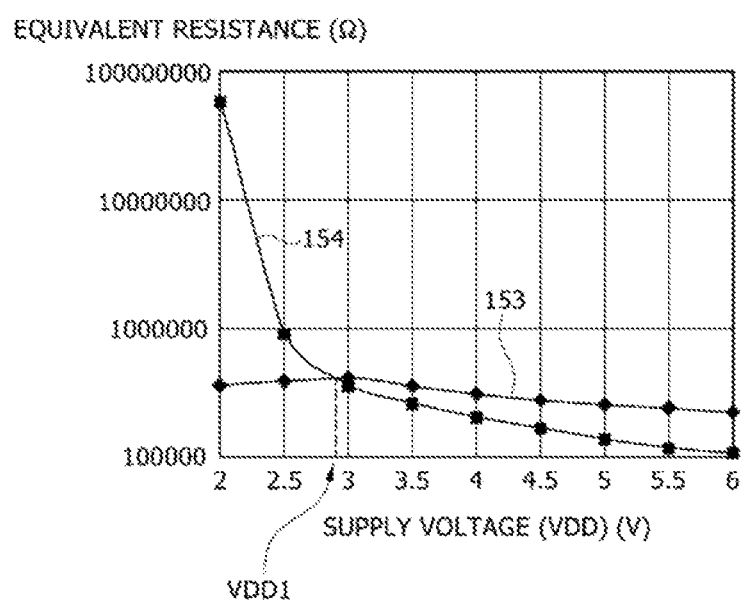
FIG. 3 is a graph illustrating equivalent resistance values of a cell transistor and a resistive portion of the nonvolatile memory device shown in FIG. 1 as a function of a supply voltage during a read operation in a programmed state of the cell transistor.

FIG. 3 is a graph illustrating equivalent resistance values of the cell transistor (i.e., the first P-channel transistor PM1) and the resistive load portion (i.e., the fourth P-channel transistor PM4) of the nonvolatile memory device 100 shown in FIG. 1 as a function of the supply voltage VDD during a read operation in a programmed state of the cell transistor. In FIG. 3, data plotted by a reference numeral "153" correspond to the first equivalent resistance values of the resistive load portion 130, and data plotted by a reference numeral "154" correspond to the second equivalent resistance values of the first P-channel transistor PM1 in a programmed state of the cell transistor.

As described with reference to FIG. 1, during a read operation of the cell transistor (i.e., the first P-channel transistor PM1) having a programmed state (i.e., an on-state) the first node node_A may have substantially the ground voltage if the second equivalent resistance value is less than the first equivalent resistance value. However, as illustrated in FIG. 3, if the supply voltage VDD is lowered, a difference between the first and second equivalent resistance values may be reduced. Furthermore, if the supply voltage VDD becomes lower than a specific supply voltage VDD1, the second equivalent resistance value may increase rapidly to be greater than the first equivalent resistance value. As a result, in case of the cell transistor having a programmed state, it may be difficult to obtain a read margin if the supply voltage VDD is lowered.

Figure 4:
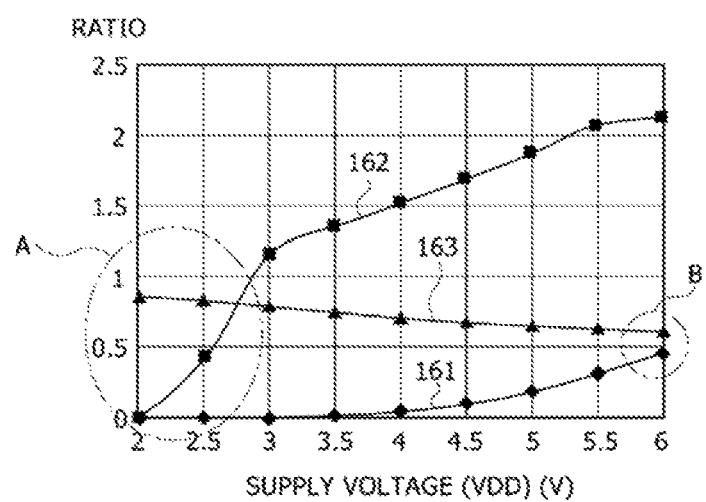
FIG. 4 is a graph illustrating a read operation margin of the nonvolatile memory device shown in FIG. 1 as a function of a supply voltage.

FIG. 4 is a graph illustrating a read operation margin of the nonvolatile memory device 100 shown in FIG. 1 as a function of the supply voltage VDD. In FIG. 4, data plotted by a reference numeral "161" correspond to ratios of the first equivalent resistance values of the resistive load portion 130 to the second equivalent resistance values of the cell transistor PM1 having an initial state (i.e., an off-state), and data plotted by a reference numeral "162" correspond to ratios of the first equivalent resistance values of the resistive load portion 130 to the second equivalent resistance values of the cell transistor PM1 having a programmed state (i.e., an on-state). In addition, data plotted by a reference numeral "163" correspond to critical ratios or reference ratios of equivalent resistance values of the resistive load portion 130 to the equivalent resistance values of the cell transistor PM1, which are suitable for successful execution of the read operation.

In a low range (e.g., a portion "A" of FIG. 4) of the supply voltage VDD, a read operation of the cell transistor having an initial state may be successfully performed, but a read operation of the cell transistor having a programmed state may be erroneously performed. In contrast, in a high range (e.g., a portion "B" of FIG. 4) of the supply voltage VDD, a read operation of the cell transistor having a programmed state may be successfully performed, but a read operation of the cell transistor having an initial state may be erroneously performed.

In order to obtain a read margin of the cell transistor having a programmed state in a low range of the supply voltage VDD, the equivalent resistance value of the resistive load portion 130 has to be increased. However, in such a case, a read margin of the cell transistor having an initial state may be reduced to cause an erroneous read operation of the initial cell transistor.

On the contrary, in order to obtain a read margin of the cell transistor having an initial state in a high range of the supply voltage VDD, the equivalent resistance value of the resistive load portion 130 has to be reduced. However, in such a case, a read margin of the cell transistor having a programmed state may be reduced to cause an erroneous read operation of the programmed cell transistor. That is, a read margin of an initial state cell transistor and a read margin of a programmed cell transistor have a trade-off relationship according to value of the supply voltage VDD.

Figure 5:
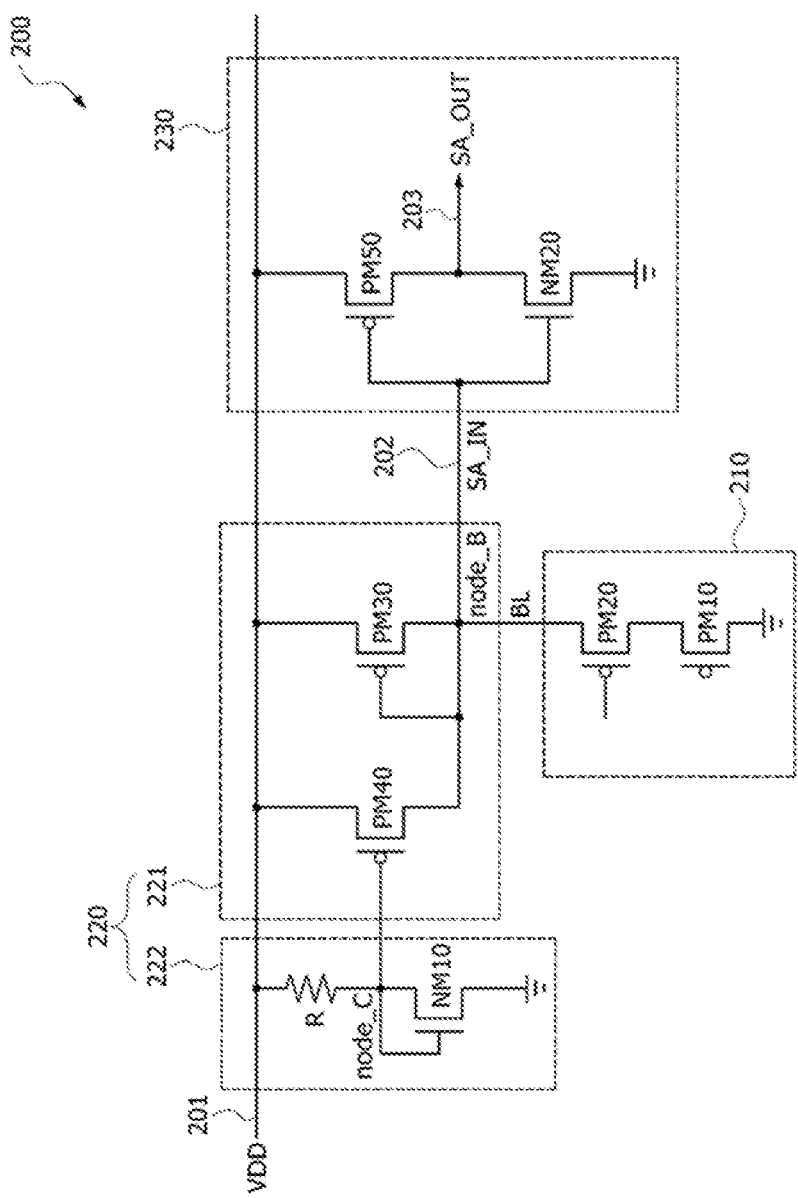
FIG. 5 is a circuit diagram illustrating a nonvolatile memory device, according to an embodiment of the present disclosure.

FIG. 5 is a circuit diagram illustrating a nonvolatile memory device 200, according to an embodiment of the present invention.

Referring to FIG. 5, the nonvolatile memory device 200 may be configured to include a nonvolatile memory cell 210, a variable resistive load portion 220 and a sensing circuit 230.

The nonvolatile memory cell 210 may be configured to include a first P-channel transistor PM10 acting as a cell transistor and a second P-channel transistor PM20 acting as a selection transistor. A gate of the first P-channel transistor PM10 may correspond to a floating gate, and a drain of the first P-channel transistor PM10 may be coupled to a ground terminal. A source of the first P-channel transistor PM10 may be coupled to a drain of the second P-channel transistor PM20. A first enablement signal EN1 acting as a selection signal may be applied to a gate of the second P-channel transistor PM20. A source of the second P-channel transistor PM20 may be coupled to a first node node_B through a bit line BL. The first P-channel transistor PM10 may have an off-state as an initial state and may have an on-state after program thereof. Thus, the first P-channel transistor PM10 having an initial state may have a relatively high equivalent resistance value and the first P-channel transistor PM10 having a programmed state may have a relatively low equivalent resistance value, during a read operation. Although not shown in FIG. 5, a redundancy cell transistor realized using the same P-channel transistor as the first P-channel transistor PM10 may be coupled in parallel with the first P-channel transistor PM10.

The variable resistive load portion 220 may be coupled between the bit line BL and a supply voltage line 201. A resistance value of the variable resistive load portion 220 between the bit line BL and the supply voltage line 201 may vary according to a supply voltage VDD applied to the supply voltage line 201. The variable resistive load portion 220 may include a resistive load portion 221 and a bias generator 222. The resistive load portion 221 may be comprised of a third P-channel transistor PM30 and a fourth P-channel transistor PM40, and the bias generator 222 may be comprised of a resistor R and a first N-channel transistor NM10.

The third and fourth P-channel transistors PM30 and PM40 may be coupled in parallel between the supply voltage line 201 and the first node node_B. Sources of the third and fourth P-channel transistors PM30 and PM40 may be coupled to the supply voltage line 201. Drains of the third and fourth P-channel transistors PM30 and PM40 and a gate of the third P-channel transistor PM30 may be coupled to the first node B. A gate of the fourth P-channel transistor PM40 may be coupled to the bias generator 222. Since the gate and the drain of the third P-channel transistor PM30 are coupled to each other, the third P-channel transistor PM30 may operate in a saturation region. Meanwhile, the fourth P-channel transistor PM40 may be turned on or off according to a voltage which is generated from the bias generator 222 and applied to the gate of the fourth P-channel transistor PM40. In an embodiment, an equivalent resistance value of the third P-channel transistor PM30 may be higher than an equivalent resistance value of the fourth P-channel transistor PM40 which is turned on. In such a case, a trans-conductance (Gm) of the third P-channel transistor PM30 may be less than a trans-conductance of the fourth P-channel transistor PM40. That is, a channel length of the third P-channel transistor PM30 may be greater than a channel length of the fourth P-channel transistor PM40, or a channel width of the third P-channel transistor PM30 may be less than a channel width of the fourth P-channel transistor PM40.

The resistor R and the first N-channel transistor NM10 constituting the bias generator 222 may be coupled in series between the supply voltage line 201 and the ground terminal. The resistor R may have a constant resistance value. One terminal of the resistor R may be coupled to the supply voltage line 201, and the other terminal of the resistor R may be coupled to a second node node_C. A drain and a source of the first N-channel transistor NM10 may be coupled to the second node node_C and the ground terminal, respectively. The second node node_C may be coupled to the gate of the fourth P-channel transistor PM40 to act as an output terminal of the bias generator 222. An output voltage outputted through the second node node_C of the bias generator 222 may be determined by the supply voltage VDD, a resistance value of the resistor R, and an equivalent resistance value of the first N-channel transistor NM10. A gate of the first N-channel transistor NM10 may be directly coupled to the drain of the first N-channel transistor NM10. Thus, the first N-channel transistor NM10 may have a diode-connected structure. Since the gate and the drain of the first N-channel transistor NM10 are coupled to each other, the first N-channel transistor NM10 may operate in a saturation region. In such a case, a drain current (Ids) of the first N-channel transistor NM10 may be expressed by the following equation 1.

$$Ids \propto (Vg-Vth)^2 \qquad \text{[Equation 1]}$$

In equation 1, "Vg" denotes a gate voltage (i.e., a drain voltage) applied to the gate and the drain of the first N-channel transistor NM10, and "Vth" denotes a threshold voltage of the first N-channel transistor NM10. Thus, a resistance ratio of the first N-channel transistor NM10 to the resistor R may vary according to the supply voltage VDD. For example, if the supply voltage VDD is increased, a resistance ratio of the first N-channel transistor NM10 to the resistor R is reduced to be close to zero. In contrast, if the supply voltage VDD is lowered, a resistance ratio of the first N-channel transistor NM10 to the resistor R is increased. If a resistance ratio of the first N-channel transistor NM10 to the resistor R is reduced as the supply voltage VDD increases, a difference between the output voltage at the second node node_C and the high supply voltage VDD also increases. On the contrary, if a resistance ratio of the first N-channel transistor NM10 to the resistor R increases as the supply voltage VDD is reduced, a difference between the output voltage at the second node node_C and the high supply voltage VDD is reduced.

The sensing circuit 230 may be realized using a complementary metal-oxide-semiconductor (CMOS) inverter comprised of a second N-channel transistor NM20 and a fifth P-channel transistor PM50. A gate of the second N-channel transistor NM20 and a gate of the fifth P-channel transistor PM50 may be coupled to the first node node_B through a sensing input line 202 that transmits a sensing input signal SA_IN. A source of the second N-channel transistor NM2 may be coupled to the ground terminal. A drain of the second N-channel transistor NM20 may be coupled to a drain of the fifth P-channel transistor PM50. A source of the fifth P-channel transistor PM50 may be coupled to the supply voltage line 201. The drains of the second N-channel transistor NM20 and the fifth P-channel transistor PM50 may be coupled to a sensing output line 203 through which a sensing output signal SA_OUT is outputted. In an embodiment, a trans-conductance of the fifth P-channel transistor PM50 may be greater than a trans-conductance of the second N-channel transistor NM20. In such a case, a read margin of the nonvolatile memory cell 210 having a programmed state may increase.

Figure 6:
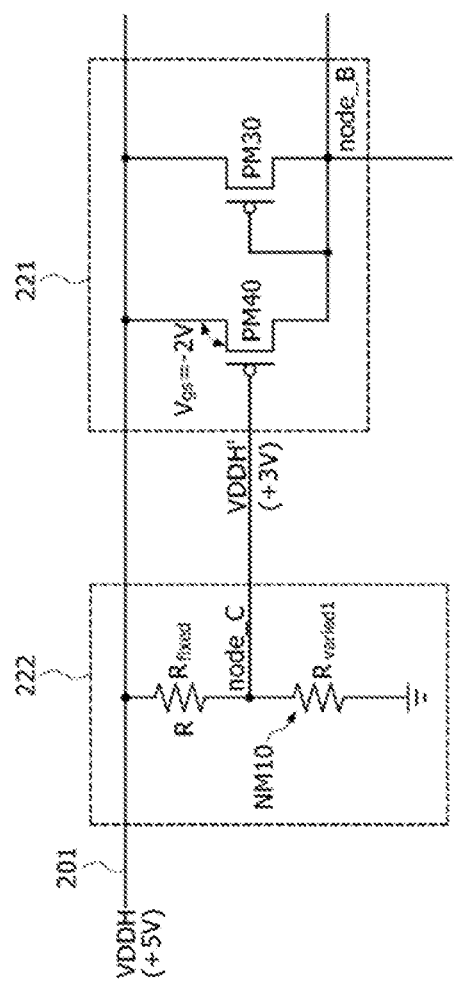
FIG. 6 is a circuit diagram illustrating equivalent resistances of a resistor and a first N-channel transistor constituting a bias generator included in the nonvolatile memory device of FIG. 5 during a read operation of a nonvolatile memory cell having an initial state when a supply voltage applied to the nonvolatile memory device has a high level.

FIG. 6 is a circuit diagram illustrating equivalent resistances of the resistor R and the first N-channel transistor NM10 constituting the bias generator 222 included in the nonvolatile memory device 200 of FIG. 5 during a read operation of a nonvolatile memory cell having an initial state when the supply voltage VDD applied to the nonvolatile memory device 200 has a high level. In FIG. 6, the same reference numerals or designators as used in FIG. 5 denote the same elements.

Referring to FIGS. 5 and 6, if a high supply voltage VDDH is applied to the supply voltage line 201, a ratio of a first resistance Rfixed of the resistor R to a second resistance Rvaried1 of the first N-channel transistor NM10 may be relatively low having a value of approximately "one". In such case, a first output voltage VDDH' outputted through the second node node_C may be determined by the ratio of the first resistance Rfixed to the second resistance Rvaried1 and the high supply voltage VDDH. If the ratio of the first resistance Rfixed to the second resistance Rvaried1 is approximately one, the first output voltage VDDH' may be about one half of the high supply voltage VDDH. If the first output voltage VDDH' is applied to the gate of the fourth P-channel transistor PM40 of the resistive load portion 221, a voltage applied between the gate and the source of the fourth P-channel transistor PM40 may correspond to a difference between the high supply voltage VDDH and the first output voltage VDDH'. The difference between the high supply voltage VDDH and the first output voltage VDDH' may be greater than an absolute value of a threshold voltage (e.g., approximately −0.7 volts) of the fourth P-channel transistor PM40. Thus, the fourth P-channel transistor PM40 may be turned on.

In an embodiment, if the high supply voltage VDDH is 5 volts, the first resistance Rfixed versus the second resistance Rvaried1 may be 2:3. In such case, the first output voltage VDDH' of 3 volts may be outputted through the second node node_C. If the first output voltage VDDH' of 3 volts is applied to the gate of the fourth P-channel transistor PM40, a gate-source voltage Vgs of the fourth P-channel transistor PM40 may be about −2 volts. Since the gate-source voltage Vgs (i.e., −2 volts) of the fourth P-channel transistor PM40 is lower than the threshold voltage (e.g., −0.7 volts) of the fourth P-channel transistor PM40, the fourth P-channel transistor PM40 may be turned on.

Figure 7:
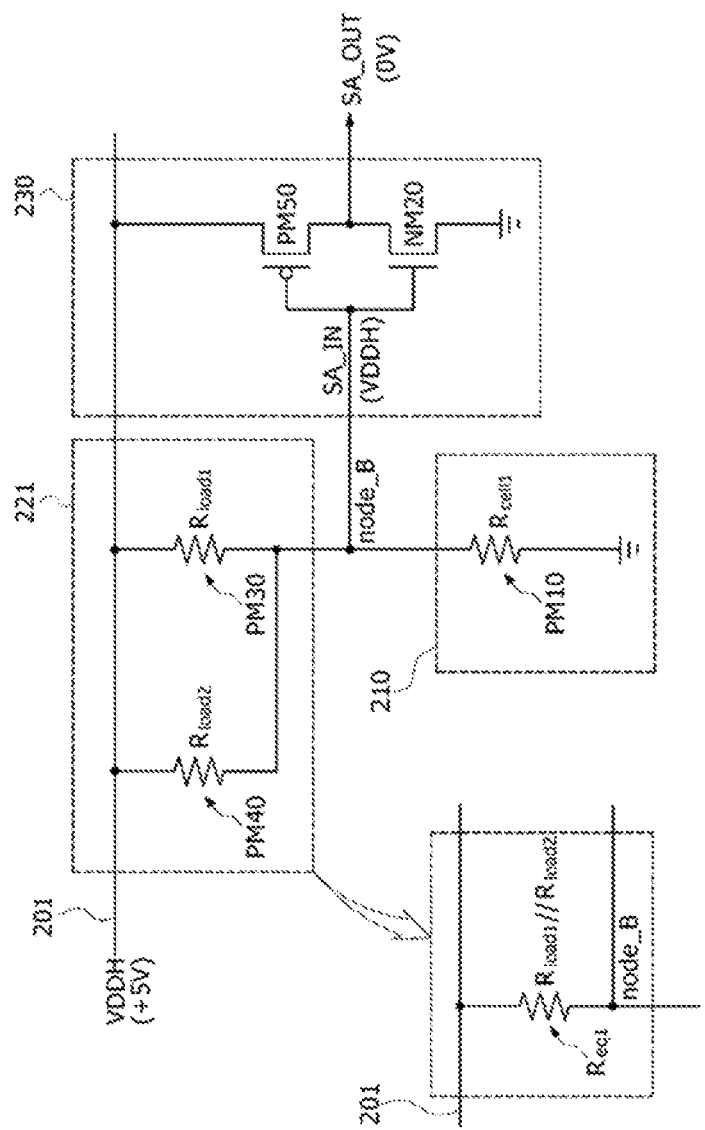
FIG. 7 is a circuit diagram illustrating equivalent resistances of a third P-channel transistor and a fourth P-channel transistor constituting a resistive load portion included in the nonvolatile memory device of FIG. 5 during a read operation of a nonvolatile memory cell having an initial state when a supply voltage applied to the nonvolatile memory device has a high level.

FIG. 7 is a circuit diagram illustrating equivalent resistances of the third P-channel transistor PM30 and the fourth P-channel transistor PM40 constituting the resistive load portion 221 included in the nonvolatile memory device 200 of FIG. 5 during a read operation of the nonvolatile memory cell 210 having an initial state when the high supply voltage VDDH is applied to the nonvolatile memory device 200. In FIG. 7, the same reference numerals or designators as used in FIG. 5 denote the same elements.

Referring to FIGS. 5 and 7, as the fourth P-channel transistor PM40 of the resistive load portion 221 is turned on, a first resistive load element corresponding to the third P-channel transistor PM30 and a second resistive load element corresponding to the fourth P-channel transistor PM40 may be coupled in parallel between the supply voltage line 201 and the first node node_B. Thus, if the high supply voltage VDDH is applied to the supply voltage line 201, the resistive load portion 221 may be replaced with an equivalent load resistor Req1 having an equivalent load resistance value "Rload1//Rload2" of the first and second load resistance values Rload1 and Rload2 of the third P-channel transistor PM30 and the fourth P-channel transistor PM40 which are coupled in parallel between the supply voltage line 201 and the first node B. As described with reference to FIG. 5, if the fourth P-channel transistor PM40 is turned on, the first load resistance value Rload1 of the third P-channel transistor PM30 may be greater than the second load resistance value Rload2 of the fourth P-channel transistor PM40. Accordingly, in such a case, the equivalent load resistor Req1 may have the equivalent load resistance value "Rload1//Rload2" which is less than the second load resistance value Rload2.

If the first P-channel transistor PM1 acting as a cell transistor of the nonvolatile memory cell 210 has an initial state, the nonvolatile memory cell 210 may have a first cell resistance value Rcell1 which is relatively high as compared with the nonvolatile memory cell 210 having the programmed first P-channel transistor PM1.

As described with reference to FIG. 2, the cell resistance value of the nonvolatile memory cell having an initial state, that is, the cell resistance value corresponding to the first cell resistance value Rcell1 may be reduced if the supply voltage VDD increases. As a result, a difference between the cell resistance value and the fixed load resistance value of the resistive load portion may be reduced. This means that a read margin of the nonvolatile memory cell having an initial state is reduced when the high supply voltage VDDH is applied to the nonvolatile memory device.

However, in case of the nonvolatile memory device according to the present embodiment, the equivalent load resistor Req1 may have the equivalent load resistance value "Rload1//Rload2" which is relatively low when the high supply voltage VDDH is applied to the nonvolatile memory device 200. Thus, a difference between the equivalent load resistance value "Rload1//Rload2" and the first cell resistance value Rcell1 may increase to obtain a sufficient read margin of the nonvolatile memory cell 210 having an initial state even if the high supply voltage VDDH is applied to the nonvolatile memory device 200. Specifically, even though the high supply voltage VDDH is applied to the nonvolatile memory device 200, the first cell resistance value Rcell1 of the nonvolatile memory cell 210 may be sufficiently high as compared with the equivalent load resistance value "Rload1//Rload2" of the resistive load portion 221. Thus, the output voltage at the first node node_B may have substantially the same level as the high supply voltage VDDH.

If the output voltage corresponding to the high supply voltage VDDH is inputted to the sensing circuit 230, the second N-channel transistor NM20 may be turned on while the fifth P-channel transistor PM50 may be turned off. Accordingly, the sensing output signal SA_OUT may have the ground voltage level.

Figure 8:
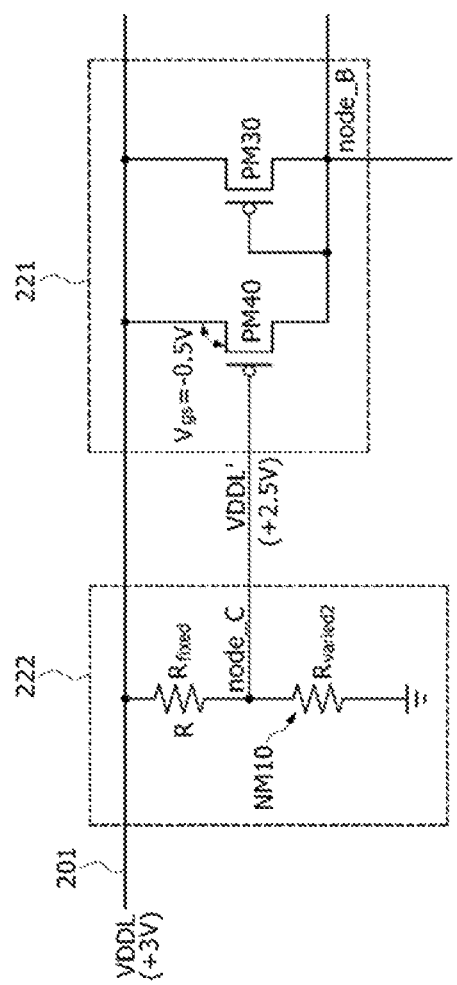
FIG. 8 is a circuit diagram illustrating equivalent resistances of a resistor and a first N-channel transistor constituting a bias generator included in the nonvolatile memory device of FIG. 5 during a read operation of a nonvolatile memory cell having a programmed state when a supply voltage applied to the nonvolatile memory device has a low level.

FIG. 8 is a circuit diagram illustrating equivalent resistances of the resistor R and the first N-channel transistor NM10 constituting the bias generator 222 included in the nonvolatile memory device 200 of FIG. 5 during a read operation of the nonvolatile memory cell 210 having a programmed state when a supply voltage applied to the nonvolatile memory device 200 has a low level. In FIG. 8, the same reference numerals or designators as used in FIG. 5 denote the same elements.

Referring to FIGS. 5 and 8, if a low supply voltage VDDL is applied to the supply voltage line 201, a ratio of a third resistance Rvaried2 of the first N-channel transistor NM10 to the first resistance Rfixed of the resistor R may be relatively high having approximately a value of five. In such case, a second output voltage VDDL' outputted through the second node node_C may be determined by the ratio of the third resistance Rvaried2 to the first resistance Rfixed and the low supply voltage VDDL. Since the ratio of the third resistance Rvaried2 to the first resistance Rfixed is approximately five, the second output voltage VDDL' may have a value that is close to the low supply voltage VDDL. If the second output voltage VDDL' is applied to the gate of the fourth P-channel transistor PM40 of the resistive load portion 221, a voltage applied between the gate and the source of the fourth P-channel transistor PM40 may correspond to a difference between the low supply voltage VDDL and the second output voltage VDDL'. The difference between the low supply voltage VDDL and the second output voltage VDDL' may be less than an absolute value of a threshold voltage (e.g., approximately −0.7 volts) of the fourth P-channel transistor PM40. Thus, the fourth P-channel transistor PM40 may be turned off.

In an embodiment, if the low supply voltage VDDL is 3 volts, the first resistance Rfixed versus the third resistance Rvaried2 may be 1:5. In such a case, the second output voltage VDDL' of 2.5 volts may be outputted through the second node node_C. If the second output voltage VDDL' of 2.5 volts is applied to the gate of the fourth P-channel transistor PM40, a gate-source voltage Vgs of the fourth P-channel transistor PM40 may be about −0.5 volts. Since an absolute value of the gate-source voltage Vgs (i.e., −0.5 volts) of the fourth P-channel transistor PM40 is less than an absolute value of the threshold voltage (e.g., −0.7 volts) of the fourth P-channel transistor PM40, the fourth P-channel transistor PM40 may be turned off.

Figure 9:
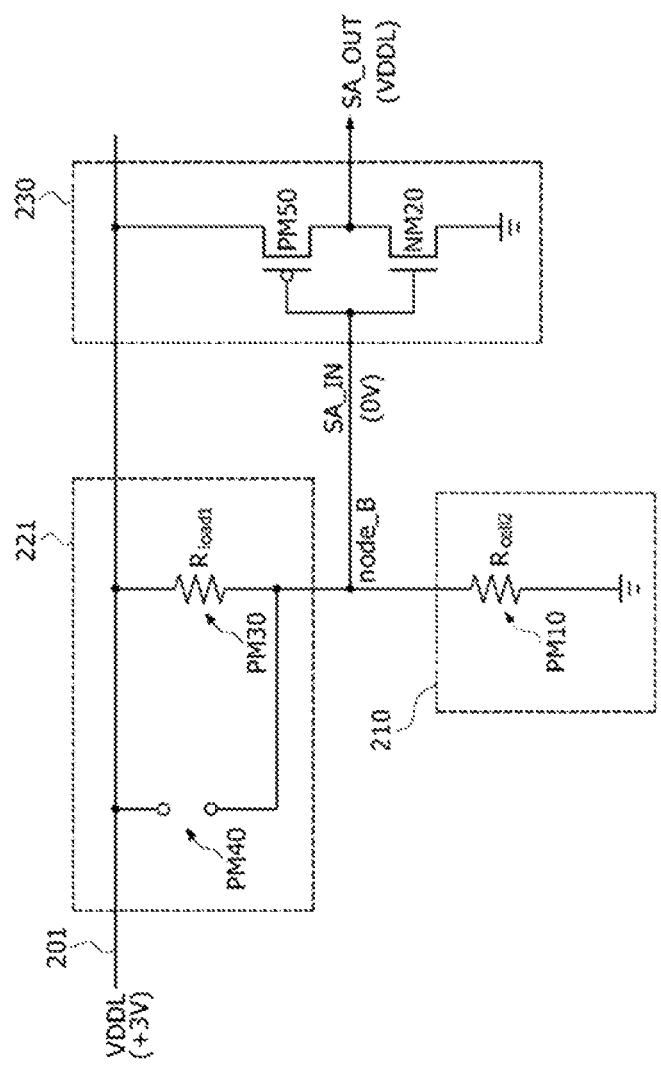
FIG. 9 is a circuit diagram illustrating equivalent resistances of a third P-channel transistor and a fourth P-channel transistor constituting a resistive load portion included in the nonvolatile memory device of FIG. 5 during a read operation of a nonvolatile memory cell having a programmed state when a supply voltage applied to the nonvolatile memory device has a low level.

FIG. 9 is a circuit diagram illustrating equivalent resistances of the third P-channel transistor PM30 and the fourth P-channel transistor PM40 constituting the resistive load portion 221 included in the nonvolatile memory device 200 of FIG. 5 during a read operation of the nonvolatile memory cell 210 having a programmed state when the low supply voltage VDDL is applied to the nonvolatile memory device 200. In FIG. 9, the same reference numerals or designators as used in FIG. 5 denote the same elements.

Referring to FIGS. 5 and 9, as the fourth P-channel transistor PM40 of the resistive load portion 221 is turned off, only a first resistive load element corresponding to the third P-channel transistor PM30 may be coupled between the supply voltage line 201 and the first node node_B. That is, if the low supply voltage VDDL is applied to the supply voltage line 201, the resistive load portion 221 may be replaced with only the first resistive load element having a first equivalent load resistance value Rload1 corresponding to an equivalent resistance value of the third P-channel transistor PM30 which is coupled between the supply voltage line 201 and the first node B.

If the first P-channel transistor PM1 acting as a cell transistor of the nonvolatile memory cell 210 has a programmed state, the nonvolatile memory cell 210 may have a second cell resistance value Rcell2 which is relatively low as compared with the nonvolatile memory cell 210 having the initial first P-channel transistor PM1.

As described with reference to FIG. 2, the cell resistance value of the nonvolatile memory cell having a programmed state, that is, the cell resistance value corresponding to the second cell resistance value Rcell2 may increase if the supply voltage VDD is lowered. As a result, a difference between the cell resistance value and the fixed load resistance value of the resistive load portion may be reduced. This means that a read margin of the nonvolatile memory cell having a programmed state is reduced when the low supply voltage VDDL is applied to the nonvolatile memory device.

However, in case of the nonvolatile memory device according to the present embodiment, an equivalent resistance value (i.e., the first equivalent load resistance value Rload1) of the third P-channel transistor PM30 may be relatively high when the low supply voltage VDDL is applied to the nonvolatile memory device 200. Thus, a difference between the first equivalent load resistance value Rload1 and the second cell resistance value Rcell2 may increase to obtain a sufficient read margin of the nonvolatile memory cell 210 having a programmed state even if the low supply voltage VDDL is applied to the nonvolatile memory device 200. Specifically, even though the low supply voltage VDDL is applied to the nonvolatile memory device 200, the first equivalent load resistance value Rload1 of the resistive load portion 221 may be sufficiently high as compared with the second cell resistance value Rcell2 of the nonvolatile memory cell 210. Thus, the output voltage at the first node node_B may have substantially the same level as the ground voltage.

If the output voltage corresponding to the ground voltage is inputted to the sensing circuit 230, the second N-channel transistor NM20 may be turned off while the fifth P-channel transistor PM50 may be turned on. Accordingly, the sensing circuit 230 may output the sensing output signal SA_OUT having a level of the low supply voltage VDDL.

Figure 10:
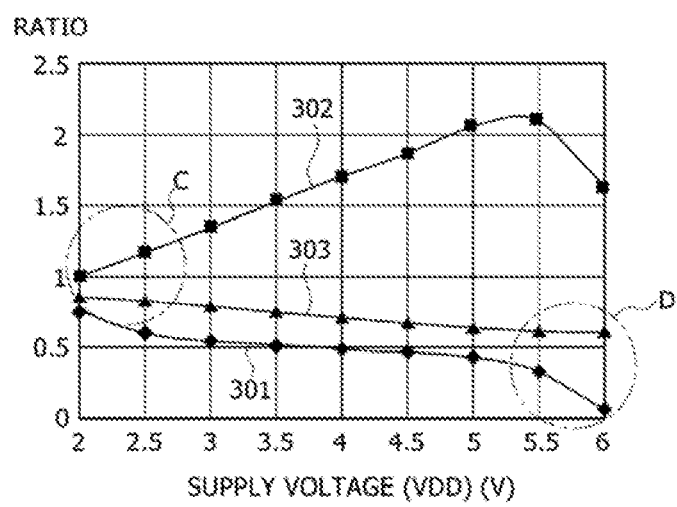
FIG. 10 is a graph illustrating a read operation margin of the nonvolatile memory device shown in FIG. 5 as a function of a supply voltage.

FIG. 10 is a graph illustrating a read operation margin of the nonvolatile memory device 200 shown in FIG. 5 as a function of the supply voltage VDD. In FIG. 10, data plotted by a reference numeral "301" correspond to ratios of the equivalent resistance values of the resistive load portion 221 to the equivalent resistance values of the nonvolatile memory cell 210 having an initial state (i.e., an off-state), and data plotted by a reference numeral "302" correspond to ratios of the equivalent resistance values of the resistive load portion 221 to the equivalent resistance values of the nonvolatile memory cell 210 having a programmed state (i.e., an on-state). In addition, data plotted by a reference numeral "303" correspond to critical ratios or reference ratios of equivalent resistance values of the resistive load portion 221 to the equivalent resistance values of the nonvolatile memory cell 210, which are suitable for successful execution of the read operation.

As illustrated in FIG. 10, according to an embodiment, a third data line plotted by the reference numeral "303" is located between a first data line plotted by the reference numeral "301" and a second data line plotted by the reference numeral "302". This means that a read operation of the nonvolatile memory cell 210 can be successfully performed without any errors in all ranges of the supply voltage VDD regardless of whether the nonvolatile memory cell 210 has an initial state or a programmed state.

Specifically, the third data line 303 is located to have a sufficient ratio difference from the second data line 302 in a low range (e.g., a portion "C" of FIG. 10) of the supply voltage VDD. Thus, it can be understood that a read operation of the nonvolatile memory cell 210 having a programmed state is performed without any errors even in a low range of the supply voltage VDD. In addition, since the third data line 303 is located over the first data line 301, a read operation of the nonvolatile memory cell 210 having an initial state may also be performed without any errors. In particular, in a high range of the supply voltage VDD, the second data line 302 is located to have a sufficient ratio difference from the third data line 303. Thus, a read operation of the nonvolatile memory cell 210 having a programmed state may also be performed without any errors in a high range of the supply voltage VDD.

Moreover, the first data line 301 is located to have a sufficient ratio difference from the third data line 303 in a high range (e.g., a portion "D" of FIG. 10) of the supply voltage VDD. This is because an equivalent resistance value of the resistive load portion 221 is reduced due to the high supply voltage VDDH during the read operation of the nonvolatile memory cell 210 having an initial state and an equivalent resistance value of the resistive load portion 221 increases due to the low supply voltage VDDL during the read operation of the nonvolatile memory cell 210 having an initial state, through an operation of the variable resistive load portion 220 of the nonvolatile memory device 200.

Figure 11:
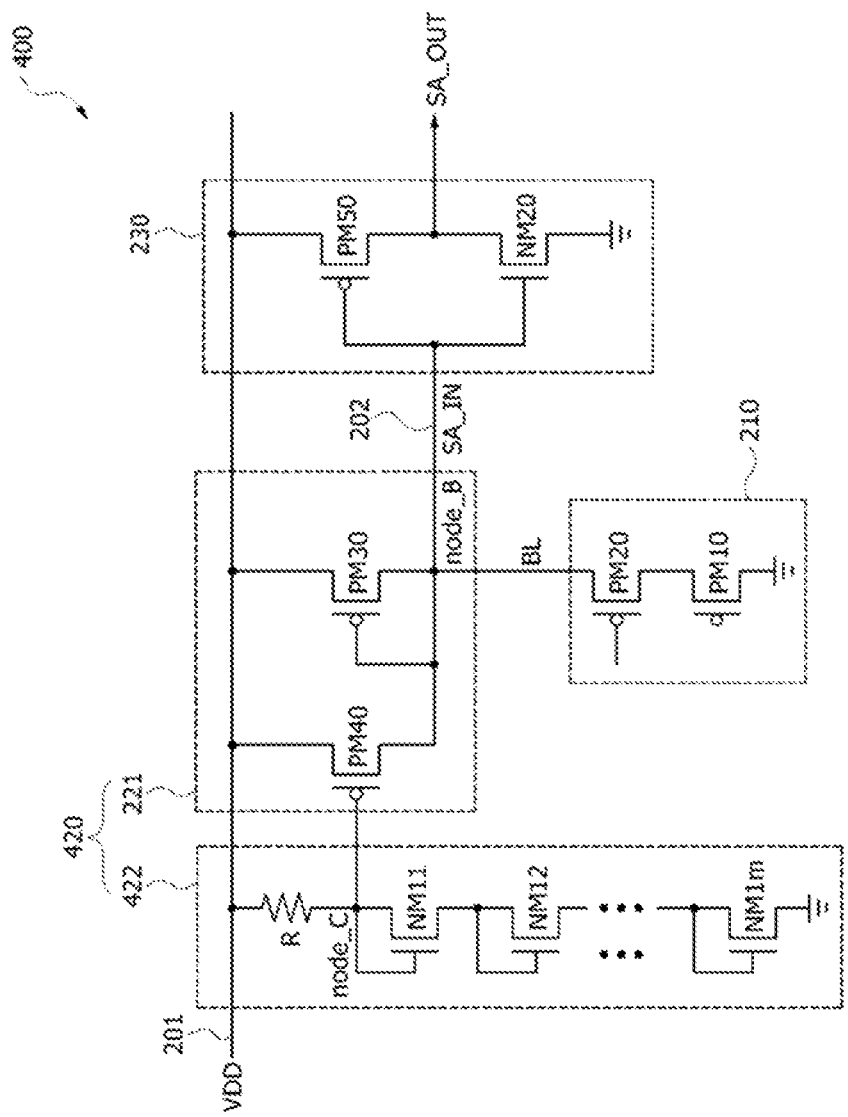
FIG. 11 is a circuit diagram illustrating a nonvolatile memory device, according to another embodiment of the present disclosure.

FIG. 11 is a circuit diagram illustrating a nonvolatile memory device 400 according to another embodiment of the present disclosure. In FIG. 11, the same reference numerals or designators as used in FIG. 5 denote the same elements. Thus, to avoid unnecessary duplicate explanation, descriptions of the same elements as illustrated in FIG. 5 may be omitted or briefly mentioned in this embodiment.

Referring to FIG. 11, the nonvolatile memory device 400 may be configured to include the nonvolatile memory cell 210, a variable resistive load portion 420 and the sensing circuit 230. The variable resistive load portion 420 may include the resistive load portion 221 and a bias generator 422. The resistive load portion 221 may be comprised of the third and fourth P-channel transistors PM30 and PM40 as described with reference to FIG. 5. The bias generator 422 may include a resistor R and a plurality of first N-channel transistors NM11 to NM1m where "m" denotes a natural number which is equal to or greater than two. The resistor R and the plurality of first N-channel transistors NM11 to NM1m may be coupled in series between the supply voltage line 201 and the ground terminal. Each of the first N-channel transistors NM11 to NM1m may have a gate and a drain which are directly connected to each other. Thus, each of the first N-channel transistors NM11 to NM1m may have a diode-connected structure. The resistor R may have a constant resistance value, that is, a fixed resistance value. One terminal of the resistor R may be coupled to the supply voltage line 201, and the other terminal of the resistor R may be coupled to the second node node_C. The second node node_C may be coupled to a gate of the fourth P-channel transistor PM40. A drain of the first N-channel transistor NM11 may be coupled to the second node node_C, and a source of the first N-channel transistor NM11 may be coupled to a drain of the first N-channel transistor NM12. A source of the last first N-channel transistor NM1m among the first N-channel transistors NM11 to NM1m may be coupled to the ground terminal.

According to the configuration of the bias generator 422 described above, a voltage at the second node node_C may correspond to a sum of threshold voltages of the plurality of first N-channel transistors NM11 to NM1m because the first N-channel transistors NM11 to NM1m having the diode-connected structures are connected in series. For example, if the number of the first N-channel transistors NM11 to NM1m is three and the threshold voltage of each of the first N-channel transistors NM11 to NM1m is +0.7 volts, a voltage at the second node node_C may not be lower than +2.1 volts. If the number of the first N-channel transistors NM11 to NM1m increases, a voltage at the second node node_C may also increase. As described with reference to FIG. 6, the resistor R may have a constant resistance value regardless of the supply voltage VDD. In contrast, each of the first N-channel transistors NM11 to NM1m may have an equivalent resistance value that varies according to the supply voltage VDD. That is, a ratio of a total resistance value of the first N-channel transistors NM11 to NM1m to the fixed resistance value of the resistor R may be reduced if the supply voltage VDD increases, whereas a ratio of a total resistance value of the first N-channel transistors NM11 to NM1m to the fixed resistance value of the resistor R may increase if the supply voltage VDD is lowered.

If the number of the first N-channel transistors NM11 to NM1m increases, a ratio of a total resistance value of the first N-channel transistors NM11 to NM1m to the fixed resistance value of the resistor R may increase at a certain supply voltage VDD. This means that the supply voltage VDD required for turning off the fourth P-channel transistor PM40 turned on at a high supply voltage VDD increases as the number of the first N-channel transistors NM11 to NM1m increases. Similarly, the supply voltage VDD for turning on the fourth P-channel transistor PM40 turned off at a low supply voltage VDD increases as the number of the first N-channel transistors NM11 to NM1m increases. For example if the number of the first N-channel transistors NM11 to NM1m is one, the fourth P-channel transistor PM40 turned on at a high supply voltage VDD of +5 volts may be turned off at the supply voltage VDD of about +3.2 volts and may maintain the turn-off state at a low supply voltage VDD below +3.2 volts. In contrast, if the plurality of first N-channel transistors NM11 to NM1m are coupled in series between the second node node_C and the ground terminal like the present embodiment, the fourth P-channel transistor PM40 turned on at a high supply voltage VDD of +5 volts may be turned off at the supply voltage VDD of about +3.5 volts and may maintain the turn-off state at a low supply voltage VDD below +3.5 volts. That is, according to the present embodiment, a range of the supply voltage VDD which is capable of turning off the fourth P-channel transistor PM40 may increase.

Figure 12:
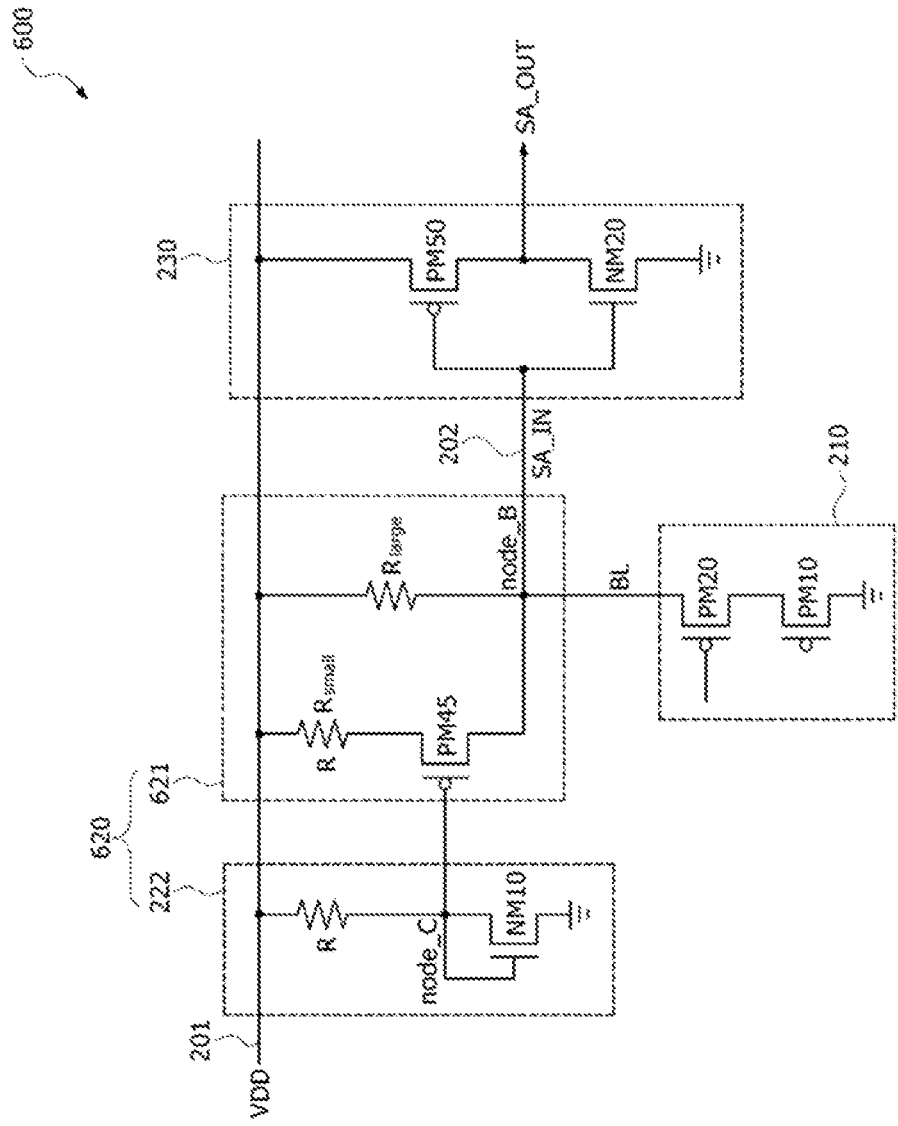
FIG. 12 is a circuit diagram illustrating a nonvolatile memory device, according to yet another embodiment of the present disclosure.

FIG. 12 is a circuit diagram illustrating a nonvolatile memory device 600 according to yet another embodiment of the present disclosure. In FIG. 12, the same reference numerals or designators as used in FIG. 5 denote the same elements. Thus, to avoid unnecessary duplicate explanation, descriptions of the same elements as illustrated in FIG. 5 may be omitted or briefly mentioned in this embodiment.

Referring to FIG. 12, the nonvolatile memory device 600 may be configured to include the nonvolatile memory cell 210, a variable resistive load portion 620 and the sensing circuit 230. The variable resistive load portion 620 may include a resistive load portion 621 and the bias generator 222. The resistive load portion 621 may be comprised of a first resistive load element Rlarge, a second resistive load element Rsmall and a switching transistor PM45. The bias generator 222 may be composed of the first N-channel transistor NM10 and the resistor R. The first resistive load element Rlarge may correspond to a first load resistor, and the second resistive load element Rsmall may correspond to a second load resistor. The first resistive load element Rlarge of the variable resistive load portion 620 may be coupled between the supply voltage line 201 and the first node node_B. The second resistive load element Rsmall and the switching transistor PM45 may be coupled in series between the supply voltage line 201 and the first node node_B. Thus, the first resistive load element Rlarge and the second resistive load element Rsmall may be coupled in parallel to the supply voltage line 201, and the first resistive load element Rlarge and the switching transistor PM45 may be coupled in parallel to the first node node_B. The switching transistor PM45 may be realized using a P-channel transistor. A source and a drain of the switching transistor PM45 may be coupled to the second resistive load element Rsmall and the first node node_B, respectively. A gate of the switching transistor PM45 may be coupled to an output terminal (i.e., the second node node_C) of the bias generator 222. The first resistive load element Rlarge may have a resistance value which is higher than a resistance value of the second resistive load element Rsmall.

If the switching transistor PM45 is turned off, only the first resistive load element Rlarge may be coupled between the supply voltage line 201 and the first node node_B and an open circuit may be provided between the second resistive load element Rsmall and the first node node_B. Thus, only a load resistance value of the first resistive load element Rlarge may exist between the supply voltage line 201 and the first node node_B. If the switching transistor PM45 is turned on, the first and second resistive load elements Rlarge and Rsmall may be coupled in parallel between the supply voltage line 201 and the first node node_B. Thus, a parallel resistance value of the first and second resistive load elements Rlarge and Rsmall may exist between the supply voltage line 201 and the first node node_B. Since the first and second resistive load elements Rlarge and Rsmall are coupled in parallel, the parallel resistance value of the first and second resistive load elements Rlarge and Rsmall coupled in parallel may be lower than a resistance value of the first resistive load element Rlarge.

As described with reference to FIGS. 6 to 9, the switching transistor PM45 may be turned on by an output voltage of the bias generator 222 in a high range of the supply voltage VDD. Thus, an equivalent resistance value between the supply voltage line 201 and the first node node_B may be relatively low in a high range of the supply voltage VDD. In contrast, the switching transistor PM45 may be turned off by an output voltage of the bias generator 222 in a low range of the supply voltage VDD. Thus, an equivalent resistance value between the supply voltage line 201 and the first node node_B may be relatively high in a low range of the supply voltage VDD. Accordingly, in a high range of the supply voltage VDD, a ratio of an equivalent load resistance value of the resistive load portion 621 to an equivalent cell resistance value of the nonvolatile memory cell 210 having an initial state (i.e., an off-state) may be lowered to improve a read margin of the nonvolatile memory cell 210 having an initial state. Moreover, in a low range of the supply voltage VDD, a ratio of an equivalent load resistance value of the resistive load portion 621 to an equivalent cell resistance value of the nonvolatile memory cell 210 having a programmed state (i.e., an on-state) may increase to improve a read margin of the nonvolatile memory cell 210 having a programmed state.

Figure 13:
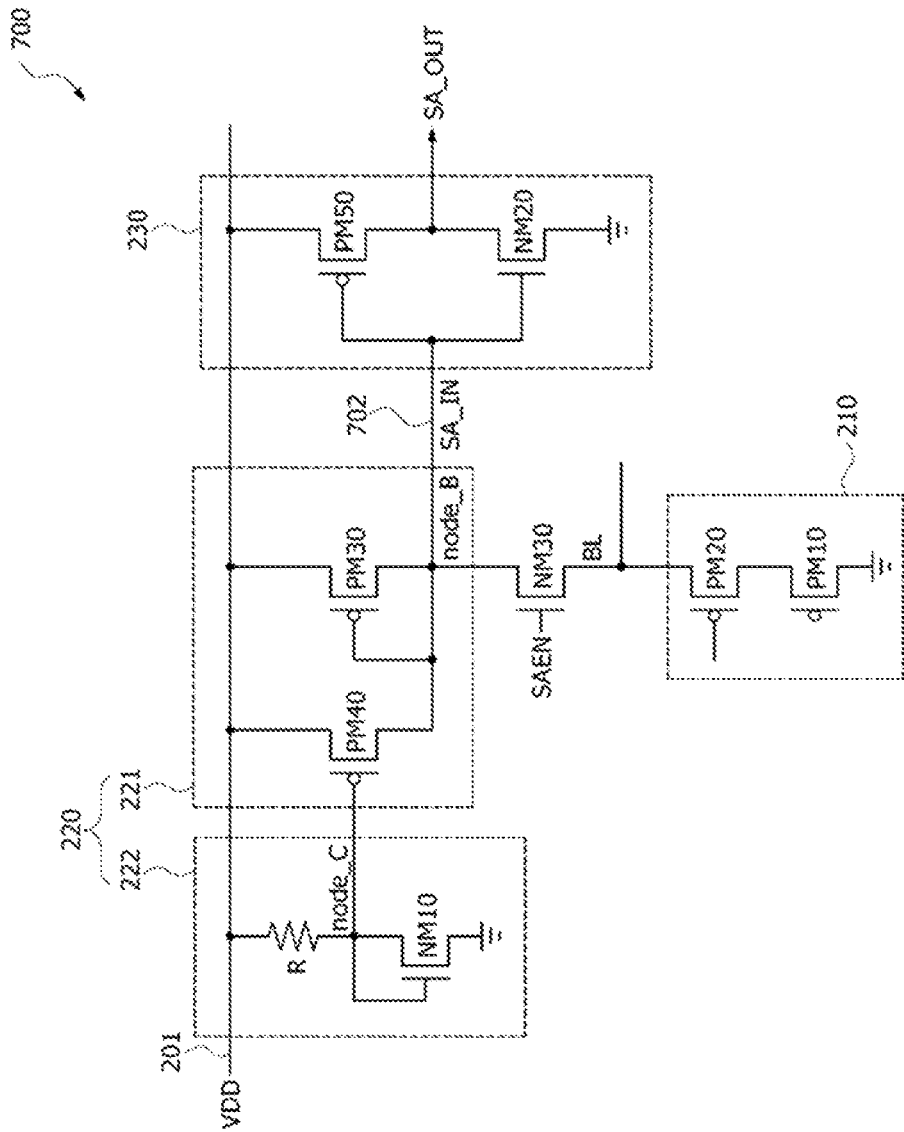
FIG. 13 is a circuit diagram illustrating a nonvolatile memory device, according to still another embodiment of the present disclosure.

FIG. 13 is a circuit diagram illustrating a nonvolatile memory device 700 according to still another embodiment of the present disclosure. In FIG. 13, the same reference numerals or designators as used in FIG. 5 denote the same elements. Thus, to avoid duplicate explanation, descriptions of the same elements as illustrated in FIG. 5 will be omitted or briefly mentioned in this embodiment.

Referring to FIG. 13, the nonvolatile memory device 700 may be different from the nonvolatile memory device 200 of FIGS. 5 to 10 in terms of an electrical connection relationship between the bit line BL of the nonvolatile memory cell 210 and the first node node_B of the resistive load portion 221. Specifically, the nonvolatile memory device 700 according to the present embodiment may further include a third N-channel transistor NM30 coupled between the bit line BL and the first node node_B while the bit line BL and the first node node_B of the nonvolatile memory device 200 are directly connected to each other. The bit line BL may be coupled to the source of the second P-channel transistor PM20 acting as a selection transistor of the nonvolatile memory cell 210. A sensing input line 702 may be coupled to the first node node_B (i.e., the drains of the third and fourth P-channel transistors PM30 and PM40). The third N-channel transistor NM30 may be coupled between the bit line BL and the sensing input line 702 to suppress a read disturbance phenomenon. A sense amplifier enablement signal SAEN may be inputted to a gate of the third N-channel transistor NM30. A drain and a source of the third N-channel transistor NM30 may be coupled to the sensing input line 702 and the bit line BL, respectively.

If the sense amplifier enablement signal SAEN is applied to the gate of the third N-channel transistor NM30 to perform a read operation, the third N-channel transistor NM30 may be turned on and a voltage difference corresponding to a threshold voltage of the third N-channel transistor NM30 may be generated between the drain and the source of the third N-channel transistor NM30. Thus, a voltage of the bit line BL may be lower than a voltage of the sensing input line 702 by the threshold voltage of the third N-channel transistor NM30.

This means that a voltage applied to the bit line BL in the present embodiment including the third N-channel transistor NM30 is lower than a voltage applied to the bit line BL in the embodiment illustrated in FIG. 5. Thus, a voltage stress applied to the first P-channel transistor PM10 acting a cell transistor of the nonvolatile memory cell 210 may be reduced during a read operation. Particularly in the event that the supply voltage VDD applied to the nonvolatile memory device 700 has a high level over a certain voltage level during a read operation, the third N-channel transistor NM30 may suppress a read disturbance phenomenon that the first P-channel transistor PM10 is undesirably programmed during the read operation.

According to the embodiments described above, an equivalent resistance value of a resistive load portion coupled between a supply voltage line and a bit line may be lowered in a high range of a supply voltage, and the equivalent resistance value of the resistive load portion coupled between the supply voltage line and the bit line may increase in a low range of the supply voltage. Thus, a read margin of a memory cell coupled between the bit line and a ground terminal may be improved even in a wide range of the supply voltage.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A nonvolatile memory device comprising:
a nonvolatile memory cell; and
a variable resistive load portion coupled between a bit line of the nonvolatile memory cell and a supply voltage line, the variable resistive load portion being suitable for changing a resistance value between the bit line and the supply voltage line according to a level of a supply voltage applied to the supply voltage line, wherein the variable resistive load portion includes:
- a resistive load portion including a first resistive load element and a second resistive load element which are coupled in parallel between the supply voltage line and the bit line; and
- a bias generator suitable for changing the second resistive load element into an open circuit when the level of the supply voltage is lower than a predetermined level.

2. The nonvolatile memory device of claim 1, wherein the nonvolatile memory cell includes a first P-channel transistor having a floating gate, a source, and a drain coupled to a ground terminal.

3. The nonvolatile memory device of claim 2, wherein the nonvolatile memory cell further includes a selection transistor coupled between the bit line and the source of the first P-channel transistor.

4. The nonvolatile memory device of claim 3, wherein the selection transistor includes a second P-channel transistor having a source coupled to the bit line, a drain coupled to the source of the first P-channel transistor, and a gate to which a first enablement signal is applied.

5. The nonvolatile memory device of claim 1, wherein the first resistive load element has a resistance value which is higher than a resistance value of the second resistive load element when the level of the supply voltage is higher than a predetermined level.

6. The nonvolatile memory device of claim 1, wherein the first resistive load element and the second resistive load element include a third P-channel transistor and a fourth P-channel transistor, respectively.

7. The nonvolatile memory device of claim 6,
wherein the third P-channel transistor operates in a saturation region, and
wherein the fourth P-channel transistor is turned on or off according to an output voltage of the bias generator.

8. The nonvolatile memory device of claim 7,
wherein the third P-channel transistor includes a source coupled to the supply voltage line, a gate coupled to the bit line, and a drain coupled to the bit line, and
wherein the fourth P-channel transistor includes a source coupled to the supply voltage line, a gate to which the output voltage of the bias generator is applied, and a drain coupled to the bit line.

9. The nonvolatile memory device of claim 8, wherein the third P-channel transistor has a trans-conductance which is less than a trans-conductance of the fourth P-channel transistor.

10. The nonvolatile memory device of claim 8, wherein a ratio of a channel length to a channel width of the third P-channel transistor is greater than a ratio of a channel length to a channel width of the fourth P-channel transistor.

11. The nonvolatile memory device of claim 8, wherein the bias generator includes a resistor and a first N-channel transistor coupled in series between the supply voltage line and a ground terminal.

12. The nonvolatile memory device of claim 11, wherein the first N-channel transistor includes a gate and a drain which are connected to each other to have a diode-connected structure.

13. The nonvolatile memory device of claim 12,
wherein the bias generator generates an output voltage through a node to which one end of the resistor and the drain of the first N-channel transistor are connected; and
wherein the output voltage of the bias generator is applied to the gate of the fourth P-channel transistor.

14. The nonvolatile memory device of claim 8, wherein the bias generator includes a resistor and a plurality of first N-channel transistors which are coupled in series between the supply voltage line and a ground terminal.

15. The nonvolatile memory device of claim 14, wherein each of the plurality of first N-channel transistors includes a gate and a drain which are connected to each other to have a diode-connected structure.

16. The nonvolatile memory device of claim 1,
wherein the first resistive load element includes a first load resistor having a first resistance value; and
wherein the second resistive load element includes a second load resistor and a switching transistor which are coupled in series.

17. The nonvolatile memory device of claim 16, wherein the switching transistor includes a P-channel transistor having a gate to which an output voltage of the bias generator is applied, a source coupled to the second load resistor, and a drain coupled to the bit line.

18. The nonvolatile memory device of claim 1, further comprising a sensing circuit including a complementary MOS inverter and coupled to the bit line.

19. The nonvolatile memory device of claim 1, further comprising a read disturbance suppression transistor coupled between the bit line and the variable resistive load portion.

20. The nonvolatile memory device of claim 19, wherein the read disturbance suppression transistor includes an N-channel transistor that includes a drain coupled to the variable resistive load portion, a source coupled to the bit line, and a gate to which a sense amplifier enablement signal is applied.

21. The nonvolatile memory device of claim 20, further comprising a sensing circuit including a complementary MOS inverter and coupled to the drain of the read disturbance suppression transistor.

* * * * *